(12) United States Patent
Tracy et al.

(10) Patent No.: US 6,452,811 B1
(45) Date of Patent: Sep. 17, 2002

(54) AUGMENTED CIRCUITRY INTEGRATION FOR A PRINTED CIRCUIT BOARD

(75) Inventors: James L. Tracy, Coral Springs; James A. Zollo, Weston, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/654,073

(22) Filed: Sep. 1, 2000

(51) Int. Cl.⁷ .............................. H05K 9/00; H05K 1/14
(52) U.S. Cl. ................. 361/816; 361/749; 361/752; 361/790; 361/800; 174/35 R; 257/659
(58) Field of Search .................. 361/733, 734, 361/752, 749, 784, 792, 800, 816, 818; 174/35 R, 35 GC; 257/659, 660

(56) References Cited

U.S. PATENT DOCUMENTS

| | | |
|---|---|---|
| 4,680,676 A | 7/1987 | Petratos et al. .............. 361/424 |
| 4,838,475 A | 6/1989 | Mullins et al. .............. 228/179 |
| 5,031,027 A | 7/1991 | Dorinski et al. .............. 357/74 |
| 5,255,155 A * | 10/1993 | Sugimoto et al. ............ 361/749 |
| 5,265,273 A | 11/1993 | Goodwin et al. ............ 455/347 |
| 5,270,488 A * | 12/1993 | Ono et al. .................. 174/35 R |
| 5,383,098 A | 1/1995 | Ma et al. ..................... 361/818 |
| 5,422,433 A | 6/1995 | Rivera et al. .......... 174/35 GC |
| 5,459,348 A * | 10/1995 | Smith ......................... 257/659 |
| 5,495,399 A | 2/1996 | Gore et al. .................. 361/814 |
| 5,548,084 A * | 8/1996 | Tracy ........................ 174/35 R |

* cited by examiner

Primary Examiner—Jayprakash N. Gandhi
(74) Attorney, Agent, or Firm—Scott M. Garrett; Barbara R. Doutre; James A. Lamb

(57) ABSTRACT

Methods and apparatus for adding additional circuitry (19) to a circuit board (11) having a radiation shield (14) associated therewith include the additional circuitry (19) mounted onto a flex circuit (21) which in turn is mounted on the radiation shield (14). A conductor (32) containing portion (24) of the flex circuit (21) extends therefrom and is routed around and through a cutout (18) in the bottom surface of the radiation shield (14). The conductor (32) is connected to the printed circuit board (11) at the location of the cutout (18) in the radiation shield (14).

10 Claims, 4 Drawing Sheets

AUGMENTED CIRCUITRY INTEGRATION FOR A PRINTED CIRCUIT BOARD

BACKGROUND OF THE INVENTION

1. Field of the Invention

This invention relates in general to the field of printed circuit boards and in particular to apparatus and methods for mounting and interfacing additional circuits, components, and connectors on a secondary board, which secondary board is associated with a printed circuit board.

2. Description of the Prior Art

The usable surface on printed circuit boards is a most important commodity. The more circuits and components that can be used with a circuit board results in a more compact electronic device which contains the circuit board. Most printed circuit boards, therefore, utilize all of the available space on the surface of the board. However, in this age of miniaturization, the ability to further reduce the overall size of an electronic device is highly desirable.

What is needed are apparatus and methods to increase the capacity of a printed circuit board by utilizing space associated with a printed circuit board which has previously been determined to be unusable.

BRIEF DESCRIPTION OF THE DRAWINGS

Various other objects, advantages, and features of the invention will become apparent to those skilled in the art from the following discussion taken in conjunction with the follow drawings, in which.

DESCRIPTION OF THE PREFERRED EMBODIMENTS

Figure 1:
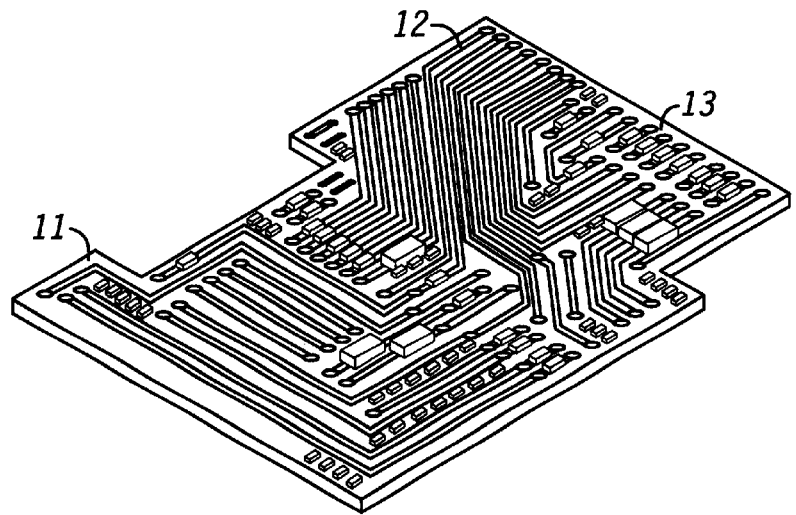
FIG. 1 illustrates a typical prior art circuit board where most of the usable surface has been employed for printed circuits and mounting of electronic components.

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Reference is now made to the drawings, wherein like characteristics and features of the present invention shown in the various figures are designated by the same reference numerals.

Reference is now made to FIG. 1 which illustrates a typical prior art printed circuit board which can be used with the present invention. Printed circuit board 11, as can be seen, is substantially filled with printed circuits 12 and solder pads or receptacles 13 for soldering electronic components to the board. That the surface of circuit board 11 is substantially filled is understandable in that one design criteria is to minimize the overall size of the circuit board 11 which is accomplished by attempting to use all of the available surface on the board. Of course, there are circuit boards which have additional usable space thereon, but even so, the present invention may be advantageously used with such circuit boards as will be more fully explained herein.

Figure 2:
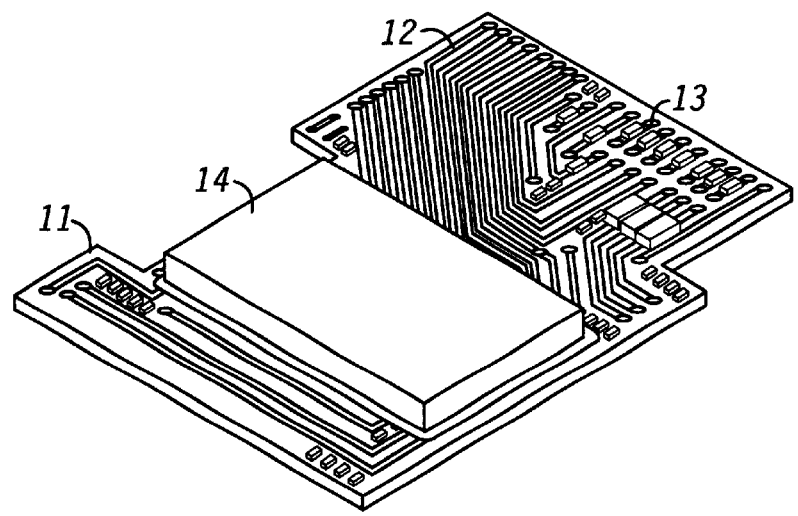
FIG. 2 illustrates the printed circuit board of FIG. 1 to which a prior art radiation shield has been added.
Figure 3:
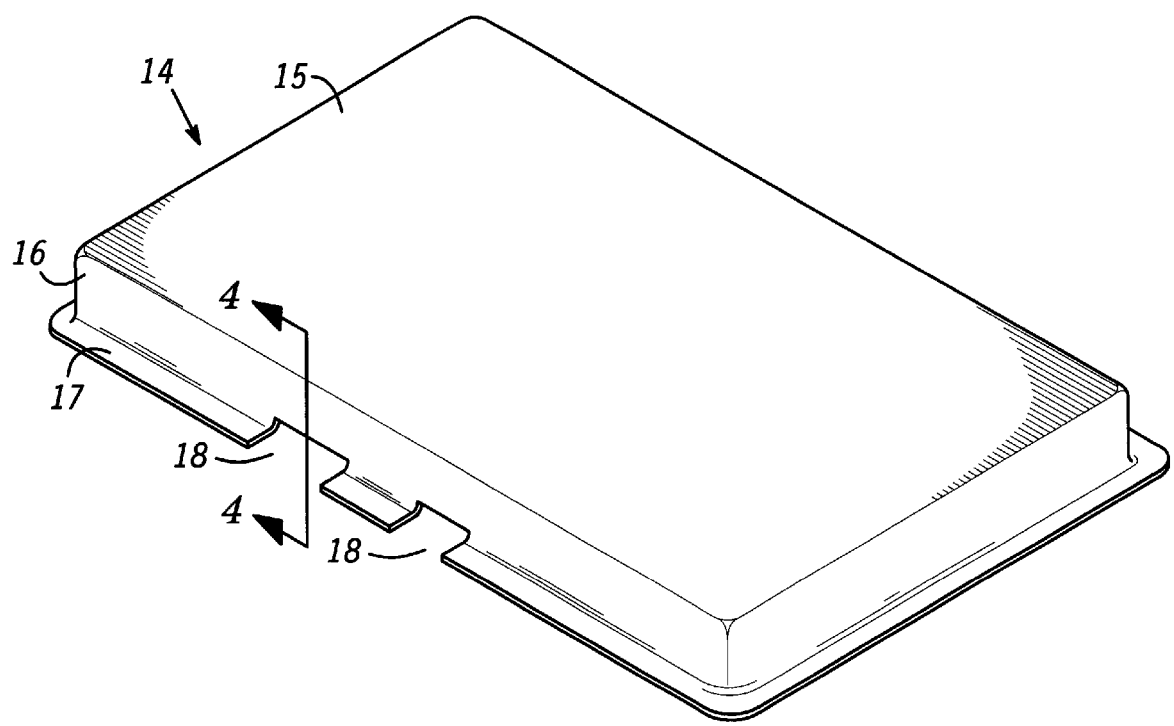
FIG. 3 illustrates cutouts in a flange of a radiation shield as provided by the present invention.

Inasmuch as some circuits emit radiation, shields have been employed to prevent the radiation from reaching the environment outside of the individual circuit printed on the board. Typically, the radiation shields comprise formed metal cans or metallized plastic cans which encompass or cover a circuit or circuits when mounted to the circuit board. Such apparatus is seen in FIG. 2. The shield 14 is shown as covering a circuit of the circuit board 11; however, shield 14 can cover more or less than that shown in FIG. 2. But generally, the coverage of a radiation shield is limited to an individual circuit. Shield 14 is mechanically attached to circuit board 11 by any of the appropriate means known to one skilled in the art. Thus, the particular means used to attach shield 14 to circuit board 11 is not shown. FIG. 3 shows a shield 14 as provided by the present invention in more detail. As previously noted, shield 14 comprises a metal or metallized box-like member having a top surface 15, four sides 16, and a bottom flange 17. The top surface 15 extends above the bottom flange 17 by a distance of approximately one to three millimeters or any other appropriate distance. The inside of shield 14 is hollow. Shield 14 is provided with one or more cutouts 18 through the bottom flange 17 as shown in FIGS. 3 and 4.

Figure 4:
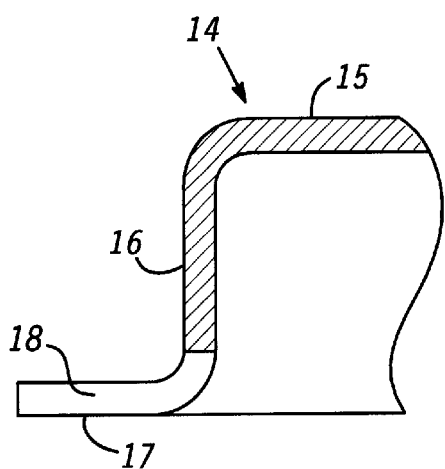
FIG. 4 is a cross-sectional view of the shield of FIG. 3 taken along the line 4—4 thereof.
Figure 5:
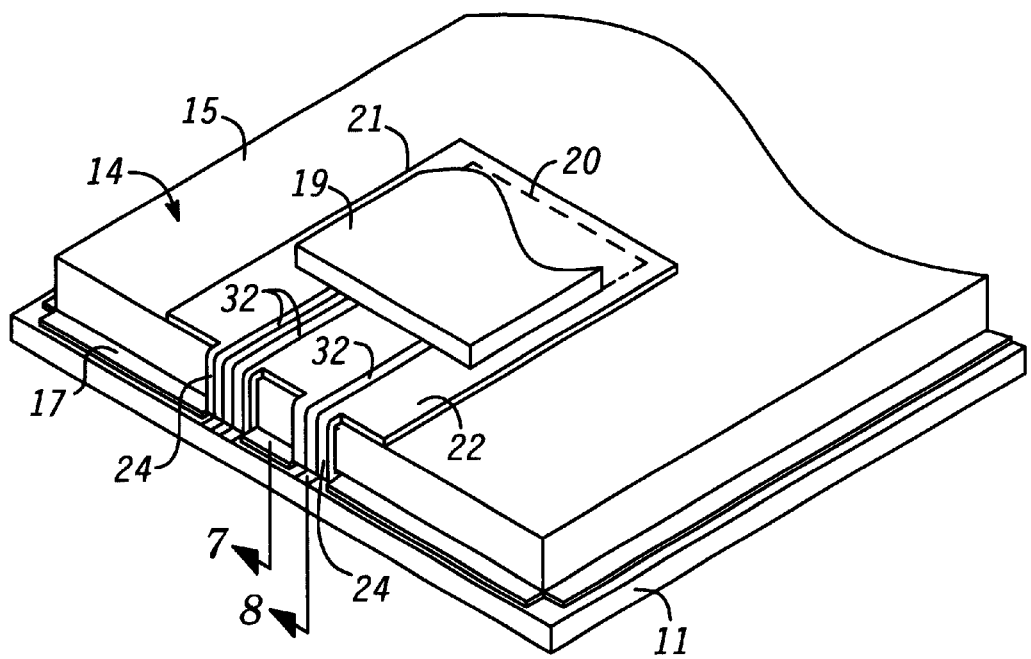
FIG. 5 illustrates augmented circuitry mounted to a radiation shield in accordance with the present invention.

FIG. 5 illustrates the shield of FIGS. 3 and 4 with an electrical component, a circuit or circuits, a contact connector, or other like electronic devices 19 connected to a flex circuit 21 which is attached to the top surface 15 of shield 14. For purposes of this specification, the described electronics 19 attached to the shield will be hereinafter referred to as the "augmented circuitry". A flex circuit typically comprises a flexible substrate 22, such as MYLAR®, with a printed circuit 20 selectively applied to a top surface of the MYLAR®. The printed circuit 20 on a flex circuit 21 functions and interfaces in the same manner as any printed circuit on a prior art circuit board. For example, it may provide for a ground connection, a connection to other printed circuits, or a connection to an electronic component such as a diode, capacitor, resistor, a contact connector, etc. Thus, in the example shown in FIG. 5, the augmented circuitry 19 is selectively and appropriately connected to the printed circuit 20 on the flex circuit 21, such as by reflow soldering. The flex circuit 21, with the augmented circuitry 19 connected thereto, may be attached by use of an appropriate adhesive.

The printed circuit 20 on the flex circuit 21 is indicated by dashed lines in that the actual circuit is not material to the present invention, it simply must be an appropriate circuit to which the augmented circuitry is to be connected. Extending from printed circuit 20 is one or more printed and spaced conductors 32 which function to appropriately connect the augmented circuitry 19 and the printed circuit 20 to the printed circuit board 11.

Figure 6:
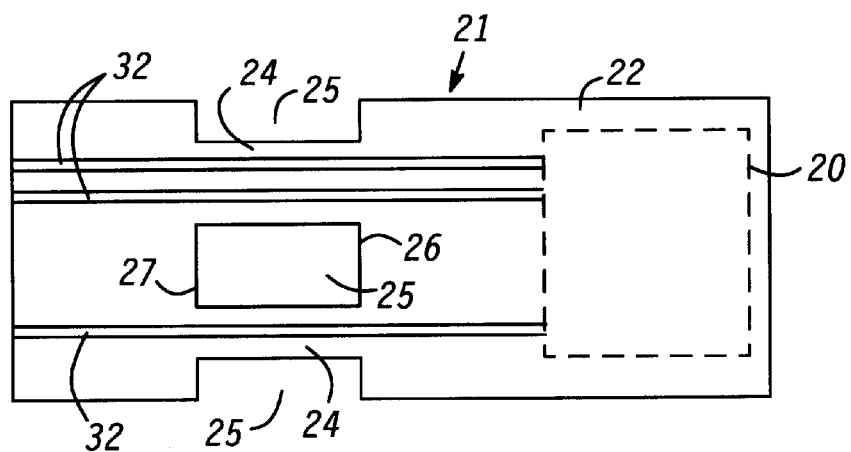
FIG. 6 is a plan view of a flexible circuit member which is used to mount augmented circuitry to a radiation shield.

A top plan view of the flex circuit 21 of the present invention is shown in FIG. 6, minus the augmented circuitry 19. In accordance with FIG. 6, it is seen the portion of the flex circuit 21 extending away from the printed circuit 20 comprises the conductors 32 printed on the substrate 22, which for purposes of this description will be referred to as the "conductor portion". The conductor portion serves to connect the augmented circuitry 19 to the printed circuit board 11. In this regard, discrete areas 25 of only the substrate 22, are removed or cut out of the conductor portion, leaving linear sections 24 of the substrate upon which the conductors 32 are located. In accordance with the present invention, the linear sections 24 areas fit through and around the cutouts 18 in shield 14. The linear sections 24 are, therefore, sized to fit within the cutouts 18 in the shield 14 or vice versa. Also, the cutouts 18 are located in shield 14 in accordance with the location of the linear sections 24 containing the conductors 32 extending from the printed circuit 20 of flex circuit 21.

In FIG. 5, it is seen that only those linear sections 24 of flex circuit 21 having the conductors 32 associated therewith extend over, through, and around the cutouts 18 in shield 14. In this manner, a minimum amount of flange 17 is removed from the shield 14. Of course, the invention is not limited to a plurality of cutouts 18. One cutout 18 can be sized and used to route all of the conductors 32 from the augmented circuitry 19 to the printed circuit board 11. It is preferable, however, that the material removed from the flange 17 be kept to a minimum.

Figure 7:
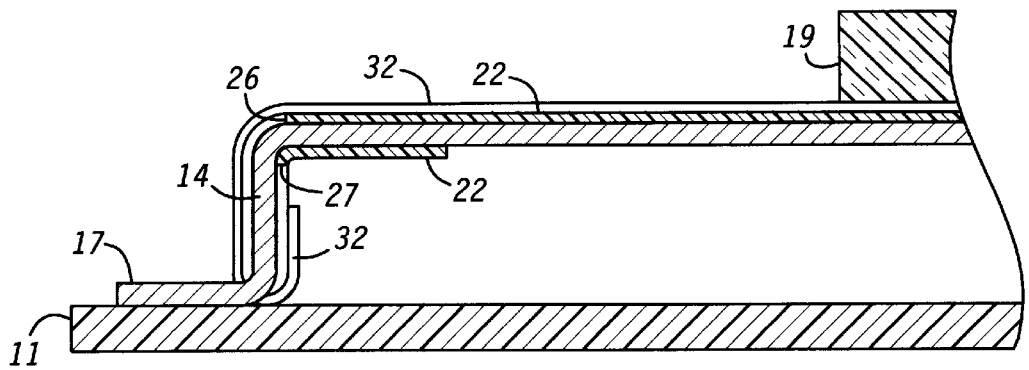
FIG. 7 is a cross-sectional view of FIG. 5 taken along the line 7—7 thereof.
Figure 8:
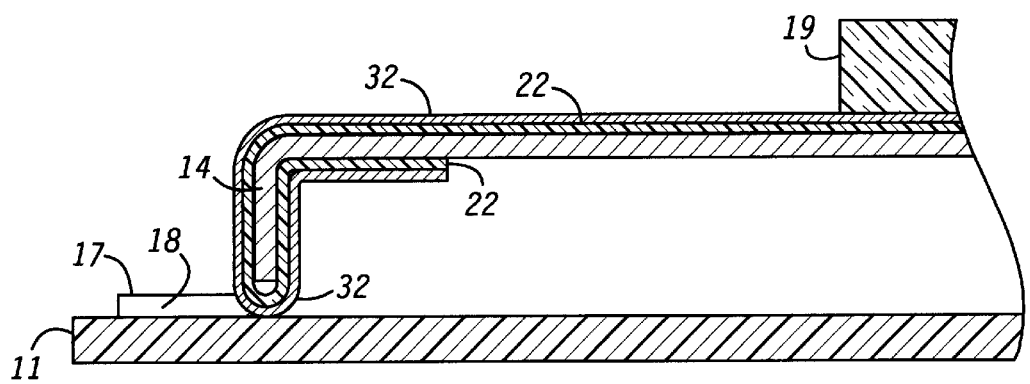
FIG. 8 is a cross-sectional view of FIG. 5 taken along the line 8—8 thereof.
Figure 9:
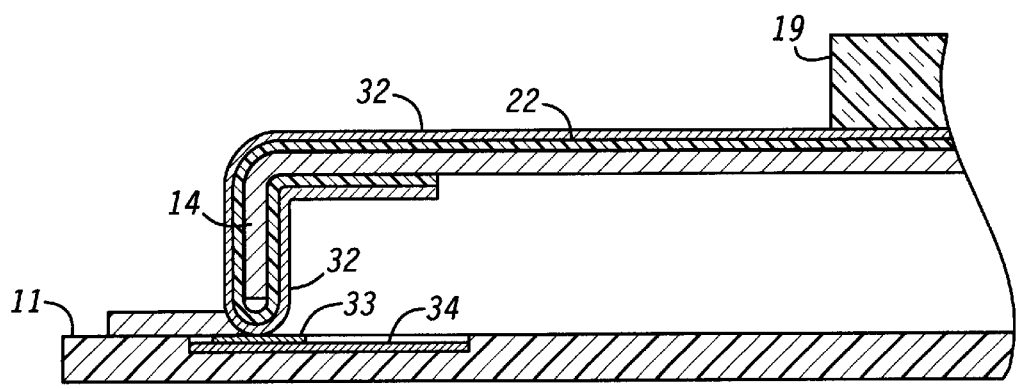
FIG. 9 is a cross-sectional view illustrating one method of connecting augmented circuitry to a location on a printed circuit board.

FIGS. 7, 8, and 9 show, in cross section, the flex circuit 21 and the conductors 32 thereof, in association with a cutout 18 in flange 17 of shield 14. FIG. 7 illustrates a cross section through the shield 14 where the substrate 22 of the flex circuit 21 not containing the conductors 32 mates with the shield 14. The edges 26 and 27 of the cutaway areas 25 of the substrate 22, are seen to be located at the approximate inside and outside corners of flange 17. The bottom surface of flange 17 at this location is, therefore, available for fitting against the printed circuit board 11 while not sacrificing the adhesion of the flex circuit substrate to the shield 14.

In the cross section of FIG. 8, the linear section 24 of the substrate, together with the conductor 32 printed thereon, is seen to extend through and around the cutout 18 in the flange 17. In this manner, the conductor 32 is prevented from contacting the metal surface of the shield while placing it in a position to be connected to an element on the printed circuit board 11.

FIG. 9 illustrates one method of electrically connecting the conductors 32 from the augmented circuit 19 to a connection location 34 on circuit board 11. A-reflow solder connection 33 is used for this purpose. Connection point 33 may be a trace connection to a circuit or component on circuit board 11. The reflow solder technique, as is known in the art, may thus be used to ultimately connect selective conductive elements 32 from the augmented circuitry 19 to any appropriate or desired element on the printed circuit board 11.

By using a radiation shield as shown and described above, a printed circuit board is, in effect, provided with additional board space for mounting and connecting other components without increasing the size of the circuit board. Thus, the methods and apparatus of the present invention can be used to advantageously add one or more functions to an electronic device without increasing the size of the same. For example, the invention can be used with a communication device to provide additional memory by using a removable memory card. Here, the augmented circuit 19 would comprise a low-profile connector, such as manufactured by AMPS, Hirose, Thomas and Betts, JST, or others, which interfaces with a miniature memory card such as a SanDisk MultiMediaCard. The space above the radiation shield would be used for the space needed by the memory card. The housing of the communication device would act as a guide for positioning the memory card relative to the shield and the low profile connector. Of course, the present invention is not limited to the above-described use.

Many other uses can be envisioned by one skilled in the art where a radiation shield provides a location for the addition of augmented circuitry, and electrical contact is established with an accompanying circuit board by the use of conductors extending around the seating surface of the radiation shield on the accompanying circuit board.

While the invention has been described, disclosed, illustrated and shown in certain terms or certain embodiments or modifications which it has assumed in practice, the scope of the invention is not intended to be nor should it be deemed to be limited thereby and such other modifications or embodiments as may be suggested by the teachings herein are particularly reserved especially as they fall within the breadth and scope of the claims here appended.

What is claimed is:

1. A radiation shield attached to a circuit board, comprising:
    a top portion;
    one or more side members attached to said top portion, extending at an angle therefrom and terminating in a bottom edge;
    said bottom edge having at least one cutout therein; and
    augmented circuitry mounted to a top surface of said radiation shield;
        wherein the radiation shield carrying a flex circuit interposed between said top portion and said augmented circuit, said flex circuit extending over one or more of said side members and within and around said at least one cutout for connecting said flex circuit with a printed circuit board.

2. Apparatus for adding augmented circuitry to a circuit board, comprising:
    a radiation shield mounted on said circuit board;
    a flex circuit mounted to a surface of said radiation shield and extending around a bottom surface of said radiation shield;
    augmented circuitry mounted on and connected to said flex circuit, one or more conductors extending from said flex circuit, said one or more conductors extending around a bottom surface of said radiation shield, said one or more conductors being connected to said circuit board and to said augmented circuit.

3. The apparatus of claim 2, wherein said flex circuit comprises a circuit printed on a flexible substrate.

4. The apparatus of claim 3, wherein said radiation shield includes at least one cutout in said bottom surface of the radiation shield, said substrate and said one or more conductors being positioned within said at least one cutout.

5. A method for adding functions to an electronic device having a radiation shield and a circuit board associated therewith, comprising the steps of:
    mounting an electronic circuit on a flexible member, the flexible member having a conductor portion;

mounting the flexible member and electronic circuit on the radiation shield, the conductor portion of the flexible member extending around a bottom surface of said radiation shield; and connecting the conductor portion of said flexible member to the circuit board.

6. The method of claim 5, including the step of providing a cutout in said bottom surface of said radiation shield and fitting said flexible member and said one or more conductors within said cutout.

7. A method for adding circuitry to a printed circuit board having a radiation shield associated therewith, comprising the steps of:

mounting a flexible circuit on the radiation shield;

wrapping said flexible circuit and one or more conductors around a bottom surface of said radiation shield connecting said one or more conductors from said flexible circuit to a location on the circuit board.

8. The method of claim 7, including the step of providing a cutout in said bottom surface of said radiation shield and fitting said flexible member and said one or more conductors within said cutout.

9. The method of claim 7, including the step of mounting and connecting augmented circuitry to said flexible circuit.

10. The method of claim 7, including the step of connecting one or more conductors from said flexible circuit to a location on said circuit board by reflow soldering.

\* \* \* \* \*